United States Patent
LeClerg et al.

(10) Patent No.: US 7,539,909 B2
(45) Date of Patent: May 26, 2009

(54) DISTRIBUTED MEMORY INITIALIZATION AND TEST METHODS AND APPARATUS

(75) Inventors: Frank E LeClerg, Portland, OR (US); Peter D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 10/676,137

(22) Filed: Sep. 30, 2003

(65) Prior Publication Data

US 2005/0071580 A1    Mar. 31, 2005

(51) Int. Cl.
  *G11C 29/00*    (2006.01)
(52) U.S. Cl. ...................................... 714/718
(58) Field of Classification Search ................ 714/718, 714/719
  See application file for complete search history.

(56) References Cited

U.S. PATENT DOCUMENTS

| | | | | |
|---|---|---|---|---|
| 4,236,207 A | | 11/1980 | Rado et al. | 364/200 |
| 4,782,486 A | * | 11/1988 | Lipcon et al. | 714/722 |
| 5,450,576 A | * | 9/1995 | Kennedy | 713/2 |
| 5,509,138 A | * | 4/1996 | Cash et al. | 711/170 |
| 5,684,979 A | * | 11/1997 | Grimes | 711/170 |
| 6,049,476 A | | 4/2000 | Laudon et al. | 365/52 |
| 6,092,146 A | | 7/2000 | Dell et al. | 711/5 |
| 6,118,719 A | | 9/2000 | Dell et al. | 365/222 |
| 6,886,109 B2 | * | 4/2005 | Olarig et al. | 714/25 |
| 7,065,688 B1 | * | 6/2006 | Moyes et al. | 714/718 |
| 7,136,951 B2 | * | 11/2006 | Deng et al. | 710/302 |
| 7,155,579 B1 | * | 12/2006 | Neils et al. | 711/154 |

* cited by examiner

*Primary Examiner*—James C Kerveros
(74) *Attorney, Agent, or Firm*—Schwegman, Lundberg & Woessner, P.A.

(57) ABSTRACT

A memory system includes multiple memory modules, which communicate with a memory controller over one or more channels. When a memory module receives an initialization command from a processor or the memory controller, the memory module performs an initialization procedure of the memory locations associated with the memory module. In an embodiment, at least a portion of the initialization procedure is performed in parallel with the other memory modules performing initialization procedures. Each memory module may include a buffer module, which receives the initialization command, and generates and sends data packets with the initialization data to the memory locations. A memory module also can receive a test command from the processor or memory controller, which causes the memory module to read data from the memory locations, compare that data with expected data, and keep track of any errors that may occur.

25 Claims, 7 Drawing Sheets

DISTRIBUTED MEMORY INITIALIZATION AND TEST METHODS AND APPARATUS

TECHNICAL FIELD

The inventive subject matter relates generally to initializing and testing memory devices, and more particularly, to initializing and testing memory in a system that includes multiple memory modules.

BACKGROUND

A typical computer system includes a processor, a memory controller, and main memory, among other things. The processor interacts with the memory controller, which controls the writing and reading of data to and from the main memory. In some systems, main memory includes multiple memory modules, each of which can include multiple storage devices (e.g., random access memory (RAM) chips).

During initial boot-up of a computer, the main memory is subjected to an initialization procedure. Using prior systems and methods, memory initialization is a processor-based operation, in which the processor runs a routine to attempt to fill each address location with predetermined, initialization data. To accomplish this task, the processor sequentially issues write commands to each memory address. The memory locations are filled linearly, beginning with the lowest physical address, and progressing through memory until attempts to initialize all of the memory locations have been made. Thus, the processor first issues commands directed toward locations associated with a first memory module, and when initialization of that memory module is completed, the processor issues commands directed toward locations associated with a second memory module, and so on.

In the past, after the memory initialization process was performed, a memory test also was performed. During the memory test, the processor would read from each memory location that it had attempted to initialize, to determine whether the predetermined initialization data existed at each location. If a read from a specific location produced data other than the predetermined data, an error was declared.

Memory initialization is a time-consuming task, particularly for systems that include large memory subsystems. For example, it is not unheard of for an initialization procedure to take minutes to perform. Market forces continually apply pressure to reduce boot-up times for various reasons. Accordingly, many systems have abandoned the memory test phase, in order to reduce the overall boot-up time. The elimination of the test phase has had a negative impact on system reliability.

Significantly reduced initialization times are difficult to achieve, in part because of the ever-increasing size of memory subsystems, and in part because of increased reliability expectations. Accordingly, what are needed are methods and apparatus that enable the initialization time of a memory subsystem to be significantly reduced. In addition, what are needed are methods and apparatus that increase the efficiency of memory initialization processes to a degree that memory tests may again be included within a boot-up procedure.

DESCRIPTION OF THE EMBODIMENTS

In the following description of various embodiments of the invention, reference is made to the accompanying drawings, which form a part hereof and show, by way of illustration, specific embodiments in which the inventive subject matter may be practiced. Various embodiments of the invention are described in sufficient detail to enable those skilled in the art to practice the inventive subject matter, and it is to be understood that other embodiments may be utilized, and that process or mechanical changes may be made, without departing from the scope of the inventive subject matter. Such embodiments of the invention may be referred to, individually and/or collectively, herein by the term "invention" merely for convenience and without intending to voluntarily limit the scope of this application to any single invention or inventive concept if more than one is in fact disclosed. It will be recognized that the methods of various embodiments can be combined in practice, either concurrently or in succession. Various permutations and combinations will be readily apparent to those skilled in the art.

Various embodiments of the inventive subject matter, described in detail herein, involve new and novel methods and apparatus for initializing and testing main memory of a computer system. Embodiments of the inventive subject matter have several significant advantages over prior art methods. Specifically, embodiments of the inventive subject matter enable main memory, or portions thereof, to be initialized and/or tested in a more rapid manner than has been achieved using prior art methods and apparatus.

Memory initialization is performed upon boot-up of a computer system, in one embodiment. In another embodiment, complete or partial memory initialization may also occur when the computer or a particular memory module is revived from a low-power mode (e.g., a "sleep" mode). A full or partial initialization also can be warranted in other situations, as well. Various embodiments of the inventive subject matter can be used in any of these or other situations, when initialization of multiple memory modules is performed.

Figure 1:
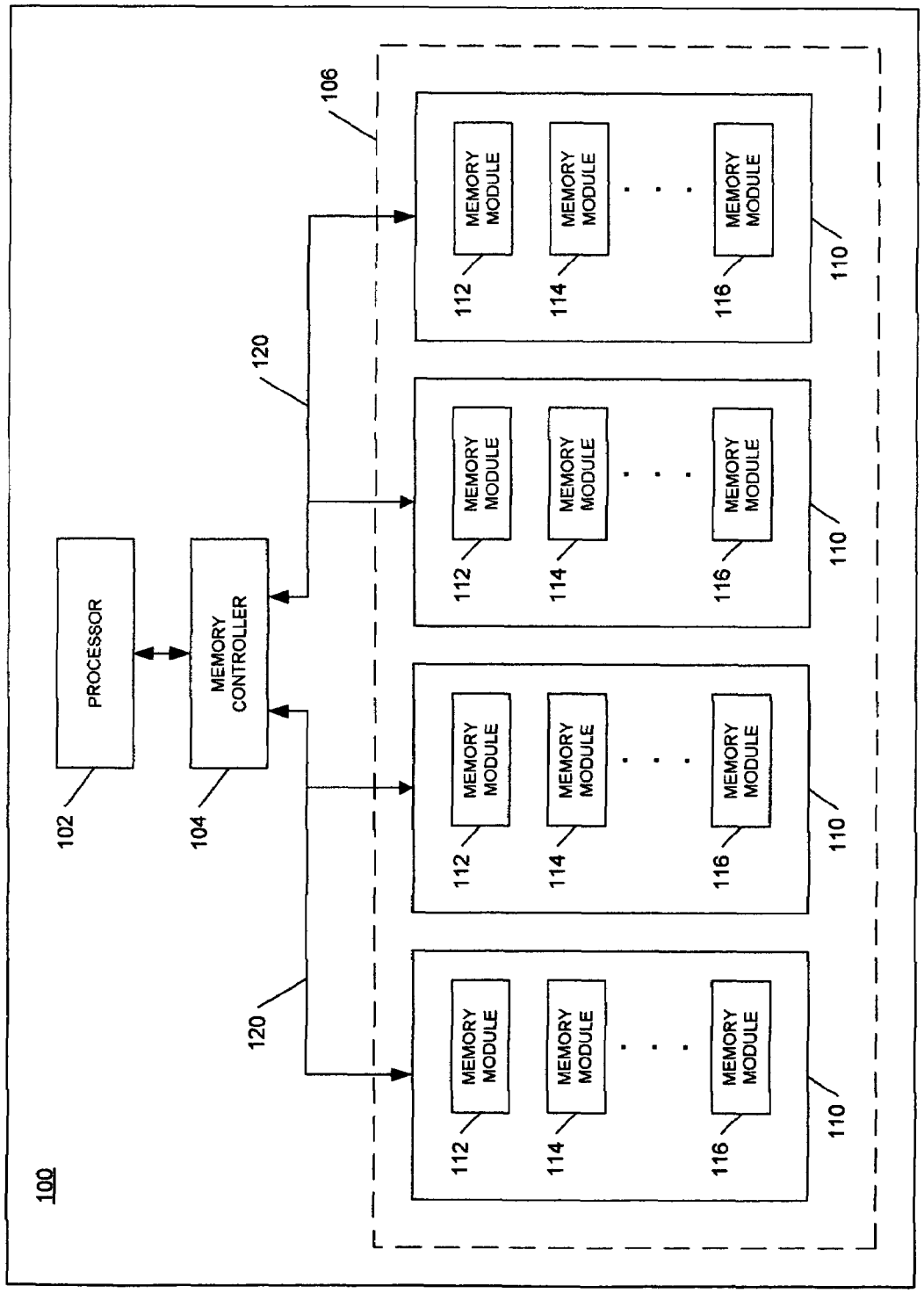
FIG. 1 illustrates a simplified block diagram of a portion of a computer system, according to an embodiment of the inventive subject matter described herein.

FIG. 1 illustrates a simplified block diagram of a portion of a computer system 100, according to an embodiment of the inventive subject matter described herein. System 100 includes at least one processor 102, at least one memory controller 104, and main memory 106, which includes at least one bank 110 of memory modules 112, 114, 116.

Processor 102 can be, for example, a general-purpose or special-purpose processor, in various embodiments. Processor 102 and memory controller 104 communicate with each other over a command/data bus 120. Processor 102 issues read and write commands through memory controller 104. In conjunction with write commands, processor 102 sends data through memory controller 104. In response to read commands, processor 102 receives data from memory controller 104.

In addition, in an embodiment of the inventive subject matter, processor 102 issues memory initialization and/or memory test commands through memory controller 104. The memory initialization and test processes are described in more detail below.

Memory controller 104 can be, for example, a north bridge, or some other type of controller. Memory controller 104 is a distinct component from processor 102, in one embodiment. In other embodiments, memory controller 104 is integrated within the same component as processor 102, or within another general purpose component.

Memory controller 104 and main memory 106 communicate with each other over one or more parallel memory module channels 120. Memory controller 104 is configured to support from one to four parallel channels 120, in one embodiment, to provide system scalability. The number of channels 120 implemented within a particular system can be selected depending on the system specifications. In alternate embodiments, memory controller 104 can be configured to support more than four channels. Accordingly, although two channels 120 are shown in FIG. 1, a single channel or more than two channels can be implemented, in other embodiments.

In one embodiment, each channel 120 supports communication with two banks 110 of memory modules 112, 114, 116. FIG. 1 illustrates each channel 120 interconnecting with two banks 110. In alternate embodiments, each channel 120 can interconnect with a single bank 110, or with more than two banks 110.

Memory controller 104 issues read and write commands to memory modules 112, 114, 116, in response to commands that memory controller 104 receives from processor 102. In conjunction with write commands, memory controller 104 sends data to the memory modules 112, 114, 116. In response to read commands, memory controller 104 receives data from memory modules 112, 114, 116, and passes that data to processor 102.

In addition, in an embodiment of the inventive subject matter, memory controller 104 receives initialization and/or memory test commands from processor 102, and passes those commands on to memory modules 112, 114, 116. In an alternate embodiment, memory controller 104 receives initialization and/or memory test commands from processor 102 and generates its own initialization and/or test commands to pass to memory modules 112, 114, 116. Again, the memory initialization and test processes are described in more detail below.

Main memory 106 includes at least one bank 110 of memory modules 112, 114, 116. In one embodiment, main memory 106 includes a plurality of banks 110 of memory modules 112, 114, 116, where each bank 110 communicates with memory controller 104 over a channel 120 associated with that bank 110. In the illustrated embodiment, four banks 110 of memory modules 112, 114, 116 and two channels 120 are shown. In alternate embodiments, more or fewer banks 110 and/or channels 120 can be implemented. In another embodiment, main memory 106 includes only one bank 110 of memory modules 112, 114, 116, which communicates with memory controller 104 over one channel 120.

Each channel 110 provides a parallel connection to one or more memory modules 112, 114, 116, in one embodiment. For example, but not by way of limitation, each channel 110 can be a parallel link having a width in a range of 2-32 bits, in one embodiment. In alternate embodiments, the channel width can be more than 32 bits, or each channel 110 can be a serial link.

A bank 110 of memory modules 112, 114, 116 includes a number of modules in a range of 1-32 modules, in one embodiment. In alternate embodiments, a bank 110 can include more than 32 modules. In one embodiment, the memory modules 112, 114, 116 within each bank 110 are coupled together via a memory module channel 120 in a "tunneled" or "daisy-chained" configuration. In this configuration, memory controller 104 is interconnected over each channel 120 with a first memory module 112 of a particular bank 110. In turn, the first memory module 112 is interconnected over the channel with a second memory module 114, and so on. Accordingly, the various memory modules 112, 114, 116 are operably connected to the memory controller 104 through multiple parallel, serial links, where the parallelism is provided by the multiple channels 110, and the serialism is provided through the daisy-chain connections along each channel 110.

In one embodiment, each memory module 112, 114, 116 is located on a separate substrate, such as an insertable printed circuit board. For example, each memory module 112, 114, 116 can be a dual in-line memory modules (DIMMs) or single in-line memory modules (SIMMs), or another type of memory module that includes a distinct set of addressable memory locations. In other embodiments, multiple memory modules can be located on a single substrate, and/or portions of the memory modules can be distributed across multiple substrates. A memory module, according to an embodiment of the inventive subject matter described herein, is described in more detail below in conjunction with FIG. 2.

The terms "downstream" and "upstream" will be used throughout the remainder of this description. The furthest memory module 116 from the memory controller 104, within of each bank 110, exists at the furthest downstream end of a channel 120. The memory controller 104 exists at the furthest upstream end of the channel 120. Accordingly, data and information that a memory module transmits toward the memory controller 104 is considered to be transmitted in an upstream direction. In contrast, data and information that a memory controller 104 transmits toward a memory module is considered to be transmitted in a downstream direction. Using similar terminology, and referring to one bank 110, memory module 116 is considered to be downstream from memory module 114, and memory modules 114 and 116 are considered to be downstream from memory module 112.

Each memory module 112, 114 (except for the furthest memory module 116) provides a tunneled connection to any downstream memory module. When desired, additional memory modules (not shown) can be added downstream from the furthest memory module 116, or additional memory modules can be inserted at any other point in the tunnel (e.g., between or above one or more existing memory modules).

In one embodiment, each memory module 112, 114 passes each received command to its next downstream memory module, regardless of the command destination (e.g., the memory module to which the command is addressed). In another embodiment, each memory module 112, 114 passes a received command in the downstream direction only if it is not the destination of the command.

Any type of information received from any memory module which is directed toward the memory controller 104 is referred to herein as "upstream data," which can include initialization and/or test status messages, data retrieved from memory, headers and other protocol information, and any other type of information received from a downstream memory module. Similarly, the term "downstream data" is used herein to mean any type of information transmitted from the memory controller 104 or an upstream memory module further down the channel. This can include initialization and test commands, memory access commands, data to be stored, headers and other protocol information. The use of the terms "message" and "data" is not meant to be limited only to actual data that is stored or retrieved. This term is also meant to include headers, other protocol information, messages, commands, and other types of information.

Figure 2:
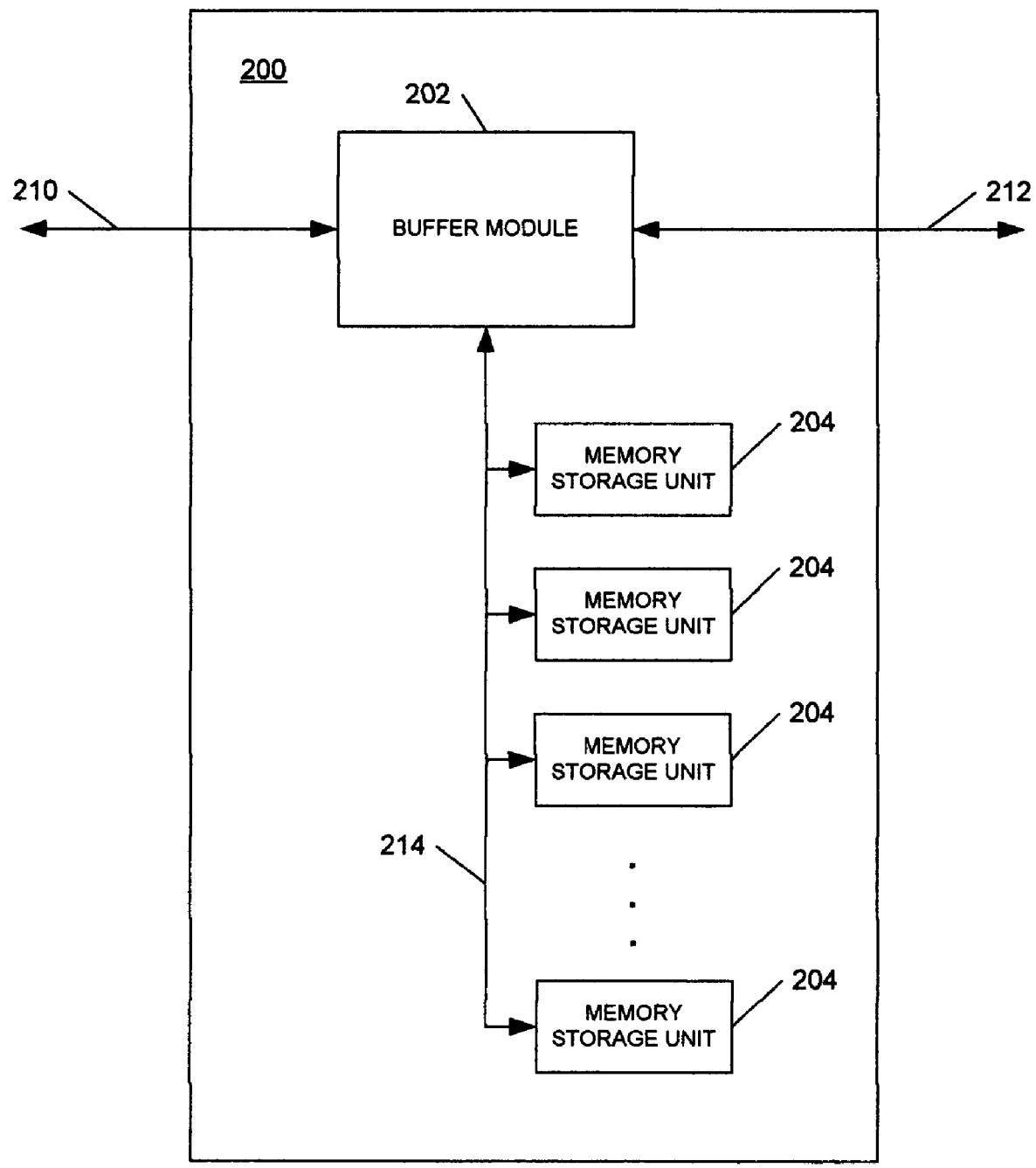
FIG. 2 illustrates a simplified block diagram of a memory module, according to an embodiment of the inventive subject matter described herein.

FIG. 2 illustrates a simplified block diagram of a memory module 200, according to an embodiment of the inventive subject matter described herein. In one embodiment, each memory module 200 includes a buffer module 202 and one or more memory devices 204. Buffer module 202 communicates with the memory controller (e.g., controller 104) and/or upstream memory modules (if any) via an upstream portion 210 of the memory module channel (referred to herein as the "upstream channel"). Buffer module 202 communicates with downstream memory modules (if any) via a downstream portion 212 of the memory module channel (referred to herein as the "downstream channel").

In one embodiment, buffer module 202 and memory devices 204 are co-located on a single substrate (e.g., a printed circuit board), which is removably connectable to the channel 210, 212. In other embodiments, buffer module 202 and one or more of the memory devices 204 can be located on separate substrates, and/or the substrates can be permanently connectable to the channel 210, 212. Either way, each buffer module 202 has a set of memory devices 204 logically located behind it, and which it may access exclusively. In one embodiment, each memory module 200 provides an amount of storage in a range of 256 megabytes to 4 gigabytes. In alternate embodiments, each memory module 200 can provide more or less storage.

In various embodiments, memory devices 204 are connected to buffer module 202 through a parallel link 214 (as shown), through point-to-point connections, through a daisy chain link, or in some other way. In one embodiment, each memory device 204 is a distinct memory component, such as a dynamic random access memory (DRAM) or synchronous DRAM device, for example. Although four memory storage units 204 are illustrated in FIG. 2, more or fewer units 204 can be included on any memory module 200.

Buffer module 202 includes one or more application-specific integrated circuits (ASICs), in one embodiment. In another embodiment, buffer module 202 includes one or more general-purpose or specific-purpose processors.

In one embodiment, when buffer module 202 receives an initialization or test command from the upstream channel 210, buffer module 202 determines whether it is the destination of the command. If so, buffer module 202 begins to initialize or test the addressable locations of the memory devices 204 associated with the memory module 200, as will be described in more detail in conjunction with FIGS. 5-8. If the buffer module 202 determines that it is not the destination of the command, it ignores the command and retransmits it on the downstream channel 212, if any downstream memory modules exist.

Figure 3:
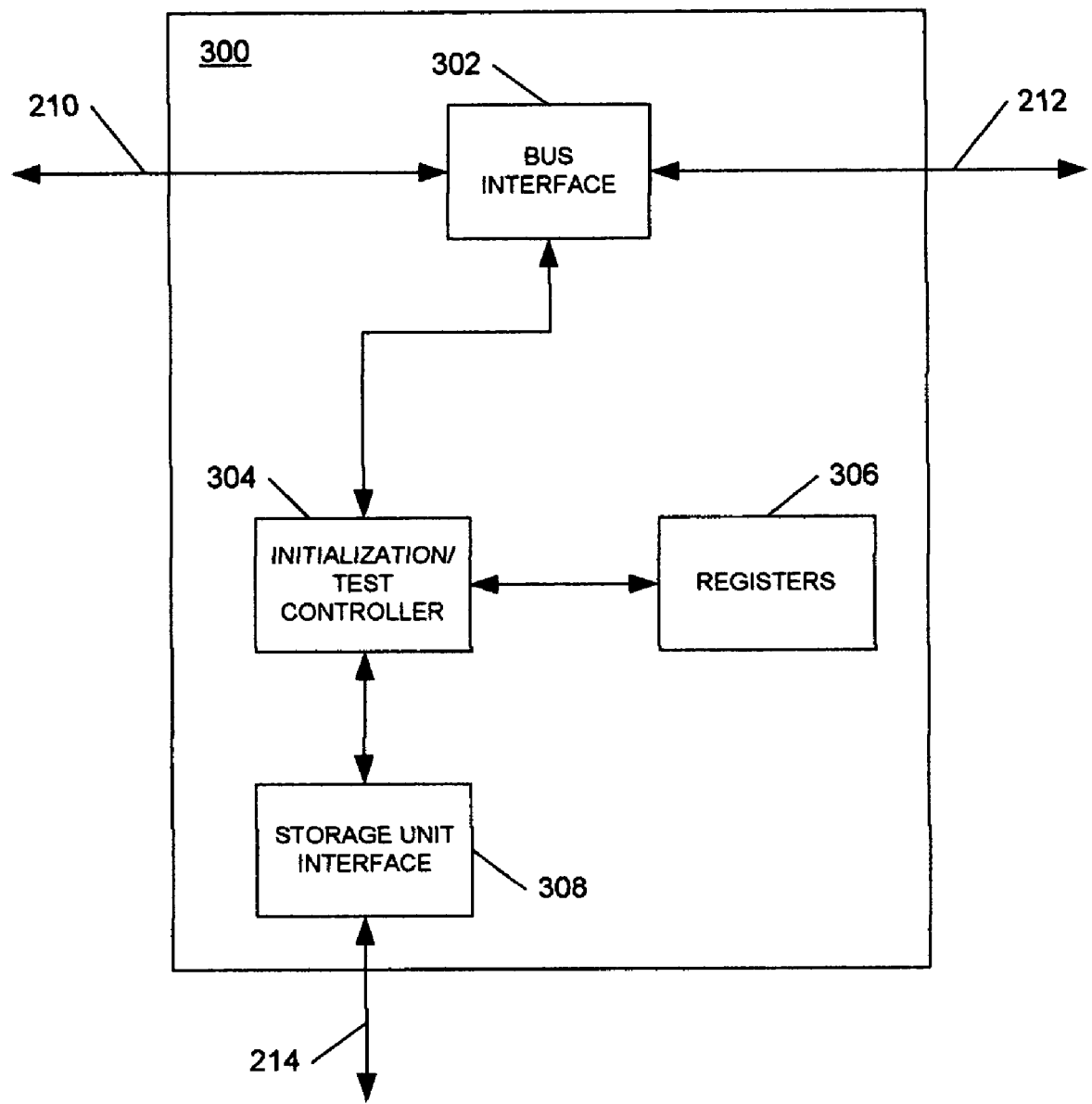
FIG. 3 illustrates a simplified block diagram of a buffer module, according to an embodiment of the inventive subject matter described herein.

FIG. 3 illustrates a simplified block diagram of a buffer module 300, according to an embodiment of the inventive subject matter described herein. In one embodiment, buffer module 300 includes various functional elements, which are illustrated as distinct blocks in FIG. 3, for the purposes of illustration. In various embodiments, the actual logic elements and hardware associated with each functional element can be resident in a single ASIC, or can be resident in multiple ASICs and/or other discrete components. Further, various aspects of the functional elements illustrated in FIG. 3 can be implemented in hardware, firmware, software or combinations thereof.

Buffer module 300 includes a bus interface 302, initialization/test controller 304, registers 306, and storage unit interface 308, in one embodiment. Buffer module 300 may include other functional and storage elements, in other embodiments, which relate to functions performed other than initialization and test functions. For the purposes of conciseness, however, those other elements are not discussed herein. For example, buffer module 300 can include one or more processing modules (not shown). Initialization/test controller 304 can be a portion of a more general processing module, or controller 304 can be a separate module.

Bus interface 302 receives and sends various messages (e.g., commands, messages, and data) on the upstream and downstream channels 210, 212. In one embodiment, bus interface 302 includes one or more buffers (not shown), that enable bus interface 302 to queue received messages for subsequent consumption by the buffer module 300, or subsequent relay on the channel 210, 212 toward a memory controller or another buffer module.

In one embodiment, bus interface 302 evaluates the destination address of received messages, and performs various tasks depending on a message's address and content. For example, if the address indicates that buffer module 300 is not the destination of the message, bus interface 302 can ignore a message or relay the message toward its intended destination (e.g., a memory controller or another memory module). If a message's address indicates that buffer module 300 is the destination of the message, bus interface 302 performs various actions, as indicated by the message's content.

For example, a message can be an initialization message, which commands the memory module 300 to perform an initialization procedure on some or all of its associated memory. As another example, a message can be a test message, which commands the memory module 300 to test some or all of its associated memory. As still another example, a message can be a polling message, which requests the status and/or results of an initialization and/or test procedure performed by the memory module 300.

In conjunction with an initialization or test procedure, initialization/test controller 304 stores various information within registers 306. In one embodiment, the registers 306 include at least the following information:

1) a "Start Initialization" register, which indicates to the initialization/test controller 304 that it should begin the process of initializing its associated storage units;
2) a "Start Test" register, which indicates to the initialization/test controller 304 that it should begin the process of testing its initialized storage units;
3) an "Initialization Complete" register, which the initialization/test controller 304 uses to indicate that the initialization process is either in progress or completed;
4) a "Test Complete" register, which the initialization/test controller 304 uses to indicate that the testing process is either in progress or completed;

5) one or more address registers, which the initialization/test controller 304 uses to indicate which address the initialization/test controller is currently initializing or testing;

6) one or more data registers, which indicate one or more data values the initialization/test controller 304 will write during the initialization process, or which indicate which data values the initialization/test controller 304 should expect to read during the testing process; and 7) one or more error registers, which the initialization/test controller 304 uses to indicate whether and/or where initialization and/or test failures occurred within the storage units. In addition, the error registers can store the error type, in one embodiment.

More, fewer or different information can be stored within registers 306, in other embodiments.

Initialization/test controller 304 sends and receives data to and from the storage units (e.g., units 204, FIG. 2) located logically behind buffer module 300 through storage unit interface 308 and link 214. This data is sent, for example, during writes to and reads from the storage units in the context of initialization and test procedures.

In one embodiment, both the initialization and test procedures are initiated by a system processor, such as processor 102 (FIG. 1), in conjunction with a memory controller 104. The initialization and/or test procedures are performed in a distributed, parallel manner, which enables the duration of these procedures to be dramatically reduced from the duration of non-distributed methods. In the past, initialization was performed in a serial manner, by sequentially initializing each memory location within a memory subsystem from the first to the last. According to embodiments of the inventive subject matter, portions of memory are initialized in parallel, as will be described more fully below. In one embodiment, each memory module can be initialized and tested in parallel with the other memory modules. During parallel initialization, multiple memory modules are simultaneously writing initialization data to their associated memory locations. During parallel test, multiple memory modules are simultaneously reading data from their associated memory locations, comparing the read data to the initialization data, and determining whether any errors are occurring. Because at least portions of the initialization and test procedures are performed in parallel across multiple memory modules, the speed of memory initialization and test can be increased by up to a factor of approximately N, where N is the number of memory modules being initialized and/or tested in parallel.

Figure 4:
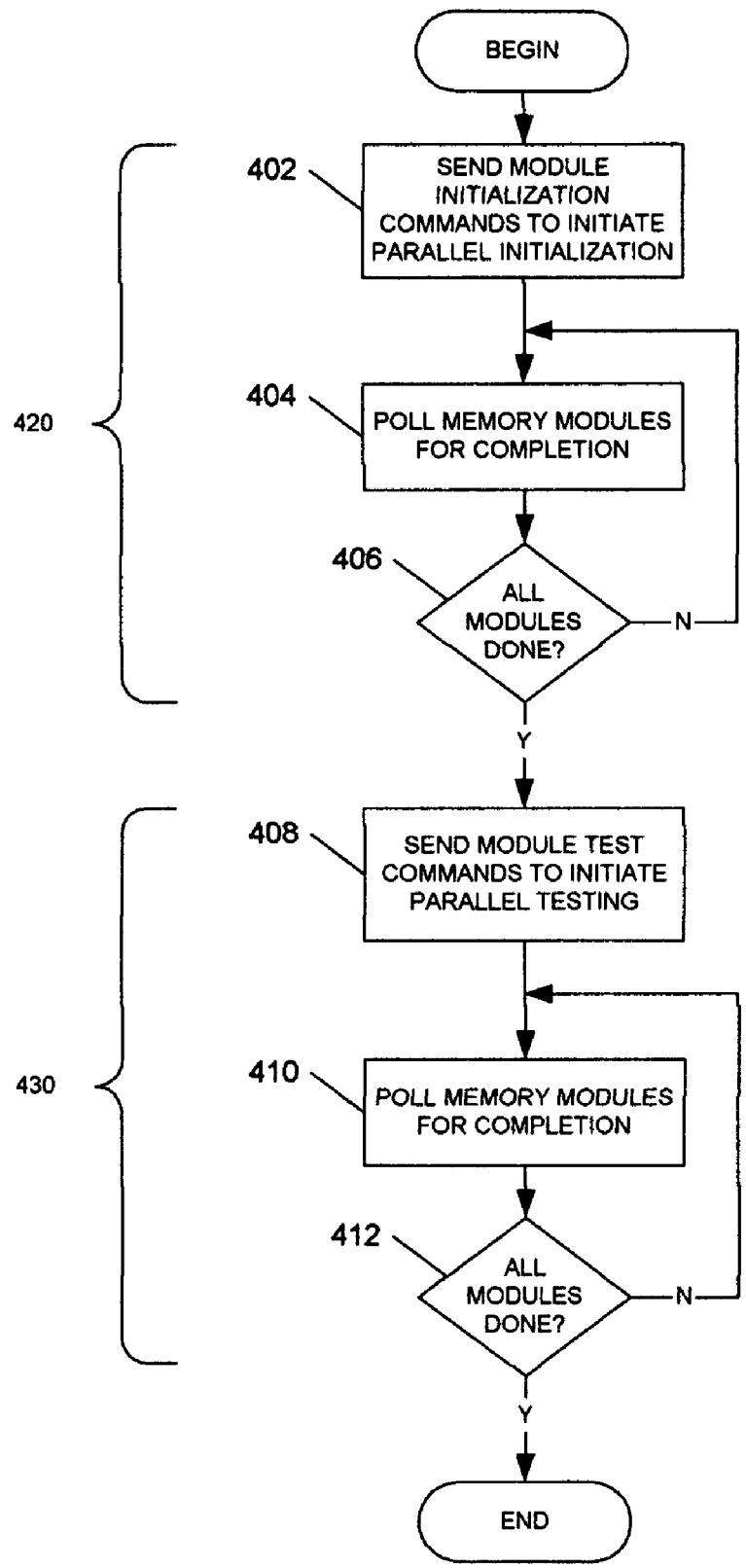
FIG. 4 illustrates a flowchart of a method for initiating memory initialization and test, according to an embodiment of the inventive subject matter described herein.

FIG. 4 illustrates a flowchart of a method for initiating memory initialization and test, according to an embodiment of the inventive subject matter described herein. The initialization procedure includes various functional blocks indicated as subset 420, and the test procedure includes various functional blocks indicated as subset 430 in one embodiment. The initialization procedure 420 is shown to occur sequentially before the test procedure 430, in FIG. 4. In other embodiments, either one of the procedures 420, 430 can be separately performed, rather than being performed in conjunction with one another. Alternatively, portions of both procedures 420, 430 can be performed in parallel.

The initialization procedure 420 begins, in one embodiment, when the processor sends one or more "Module Initialization" commands to a set of one or more memory modules, in block 402. A Module Initialization command can be defined as a memory access procedure command. When sent to multiple memory modules, the Module Initialization commands initiate a parallel initialization process, as each of the multiple memory modules can begin to initialize its associated memory locations in parallel with the other memory modules performing similar initialization procedures. In one embodiment, each Module Initialization command is sent from the processor through the memory controller, although the memory controller does not significantly alter the format of the command. In another embodiment, the Module Initialization commands are sent to the modules without passing through the memory controller.

In one embodiment, a Module Initialization command is addressed and sent to each memory module that is affected by the initialization process. For example, if the memory subsystem includes 32 memory modules, and initialization of the entire memory subsystem is being performed, the processor sends 32 Module Initialization commands, each separately addressed to a particular memory module. In an alternate embodiment, the processor sends a Module Initialization command that addresses all or a subset of the entire group of memory modules.

Referring again to FIG. 4, after the Module Initialization commands have been sent to the memory modules, the system enters a "poll for completion" state, in one embodiment. Accordingly, each memory module is occasionally or periodically polled, in block 404, until the module indicates that it has completed the initialization process. In one embodiment, the processor sends an "Initialization Status Query" message to each memory module that has not yet indicated that it has completed its initialization.

In response, each polled memory module returns an "Initialization Status" message, which either indicates that the module has completed the initialization process for its associated storage units, or that the module has not completed the initialization process. In one embodiment, the polling process continues to iterate until all modules have indicated that they are done with their associated initialization processes, as indicated by decision block 406.

Although the poll for completion process 404 is shown to occur sequentially after sending the Module Initialization commands, in block 402, it is not necessary to wait for all Module Initialization commands to be sent before entering the poll for completion process. For example, once a Module Initialization command has been sent to a particular memory module or set of modules, the poll for completion state can be entered for those modules, regardless of whether Module Initialization commands have been sent to the rest of the modules being initialized.

In alternate embodiments, each memory module is not polled to determine whether it has completed its initialization process. Instead, in various embodiments, each memory module sends an Initialization Status message to the processor, or produces a processor interrupt, upon completion of its initialization procedure. In other words, each memory module does not wait to be polled for completion. Instead, it takes it upon itself to alert the processor when it has completed its initialization procedure.

Once all modules have indicated that they are done, the system performs a test procedure 430, in one embodiment. In an alternate embodiment, portions of the initialization and test procedures 420, 430 can be performed in parallel with each other, rather than performing the test procedure 430 sequentially after the initialization procedure 420 is completed. For example, once a particular memory module has completed its initialization procedure, a test procedure can be initiated for that module, regardless of whether other memory modules have completed their initialization procedures.

The test procedure 430 begins, in one embodiment, when the processor sends one or more "Module Test" commands to a set of one or more memory modules, in block 408. A Module Test command can be defined as a memory access procedure command. When sent to multiple memory modules, the Module Test commands initiate a parallel testing process, as each of the multiple memory modules can begin to test its associated memory locations in parallel with the other memory modules performing similar testing procedures. In one embodiment, each Module Test command is sent from the processor through the memory controller, although the memory controller does not significantly alter the format of the command. In another embodiment, the Module Test commands are sent to the modules without passing through the memory controller.

In one embodiment, a Module Test command is addressed and sent to each memory module that is affected by the initialization process. In an alternate embodiment, the processor sends a Module Test command that addresses all or a subset of the entire group of memory modules.

Many types of memory test strategies can be used. For example, a test can verify data sequentially within a block of memory, or a test can verify data randomly within a block of memory. A test can include one read command to a single address, or multiple read commands to a single address. Accordingly, the Start Test command can include various parameters that specify what type of test to perform, and/or what range of memory addresses should be initialized/tested, and/or what test pattern should be used to perform initialization/testing. For the purposes of conciseness, the description below discusses a sequential test within each of the various memory modules. However, it is to be understood that embodiments of the inventive subject matter encompass a wide variety of other types and ranges of tests.

Referring again to FIG. 4, after the Module Test commands have been sent to the memory modules, the system enters a "poll for completion" state, in one embodiment. Accordingly, each memory module is occasionally or periodically polled, in block 410, until the module indicates that it has completed the test process. In one embodiment, the processor sends a "Test Status Query" message to each memory module that has not yet indicated that it has completed its testing.

In response, each polled memory module returns a "Test Status" message, which either indicates that the module has completed the testing process for its associated storage units, or that the module has not completed the testing process. If a module returns a Test Status message, which indicates that testing is completed, the module also returns information indicating the results of the test, in one embodiment. The Test Status message will be described in more detail in conjunction with FIG. 8.

In one embodiment, the polling process continues to iterate until all modules have indicated that they are done with their associated testing processes, as indicated by decision block 412. After initialization and testing has completed, the method ends.

Although the poll for completion process 410 is shown to occur sequentially after sending the Module Test commands, in block 408, it is not necessary to wait for all Module Test commands to be sent before entering the poll for completion process. For example, once a Module Test command has been sent to a particular memory module or set of modules, the poll for completion state can be entered for those modules, regardless of whether Module Test commands have been sent to the rest of the modules being initialized.

In an alternate embodiment, each memory module is not polled to determine whether it has completed its testing process. Instead, each memory module sends a Test Status message and/or a processor interrupt to the processor upon completion of its testing procedure. In other words, each memory module does not wait to be polled for completion. Instead, it takes it upon itself to alert the processor when it has completed its testing procedure.

The initialization and test procedures 420, 430 are shown to be sequential, in FIG. 4. In another alternate embodiment, a memory module can initialize and test one or more memory locations in an alternating manner, rather than beginning the test procedure when the initialization procedure has completed. For example, after each write to a memory location (or a set of fewer than all locations associated with the memory module), a read of that location (or locations) can be performed, in order to verify that the initialization data was properly stored and is retrievable.

In an above-described embodiment, the processor (e.g., processor 102, FIG. 1) sends Module Initialization and Module Test commands to each memory module (e.g., modules 112, 114, 116). In an alternate embodiment, the processor instead sends a "Start Initialization" and a "Start Test" command to the memory controller, and the memory controller generates and sends the Module Initialization and Module Test commands to the memory modules.

Figure 5:
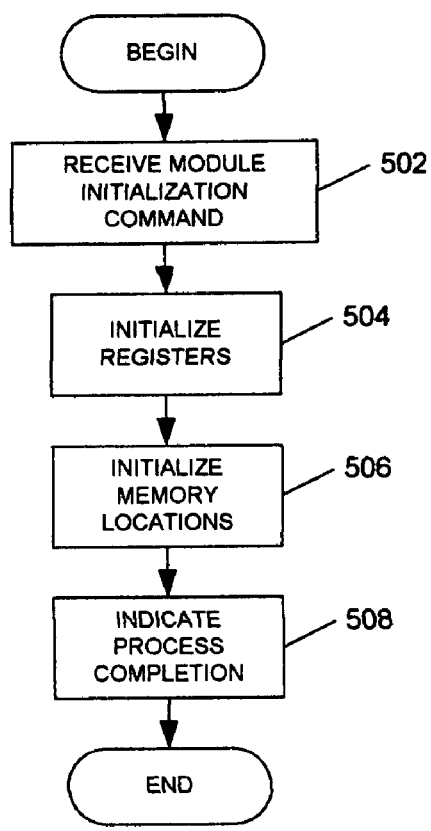
FIG. 5 illustrates a flowchart of a method for a memory module to initialize memory, according to an embodiment of the inventive subject matter described herein.

Also in an embodiment described above, each memory module generates and sends out the actual data packets to its associated storage units (e.g., units 204), as will be further described in conjunction with FIG. 5. In another alternate embodiment, the memory controller sends the data packets to each memory module, which in turn sends the packets to the appropriate storage units. In this embodiment, the memory controller can send data packets in parallel over the various channels 120, if parallel channels are implemented. If parallel channels are not implemented, the efficiency of the process may be decreased.

Further, in embodiments described above, after an initialization procedure has completed, the processor specifically commands that a test procedure be performed. In an alternate embodiment, the test procedure can be automatically performed upon completion of the initialization procedure.

Figure 6:
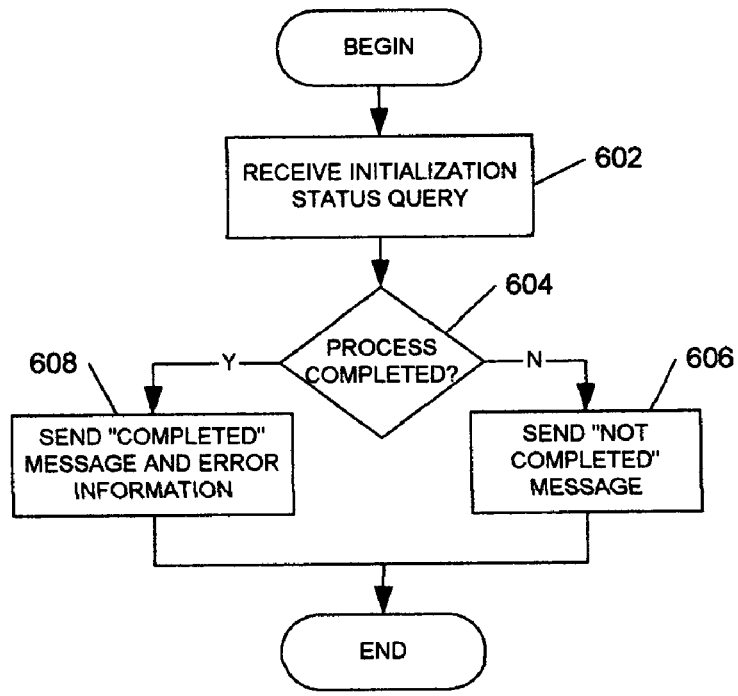
FIG. 6 illustrates a flowchart of a method for a memory module to indicate the status of its initialization process, according to an embodiment of the inventive subject matter described herein.
Figure 7:
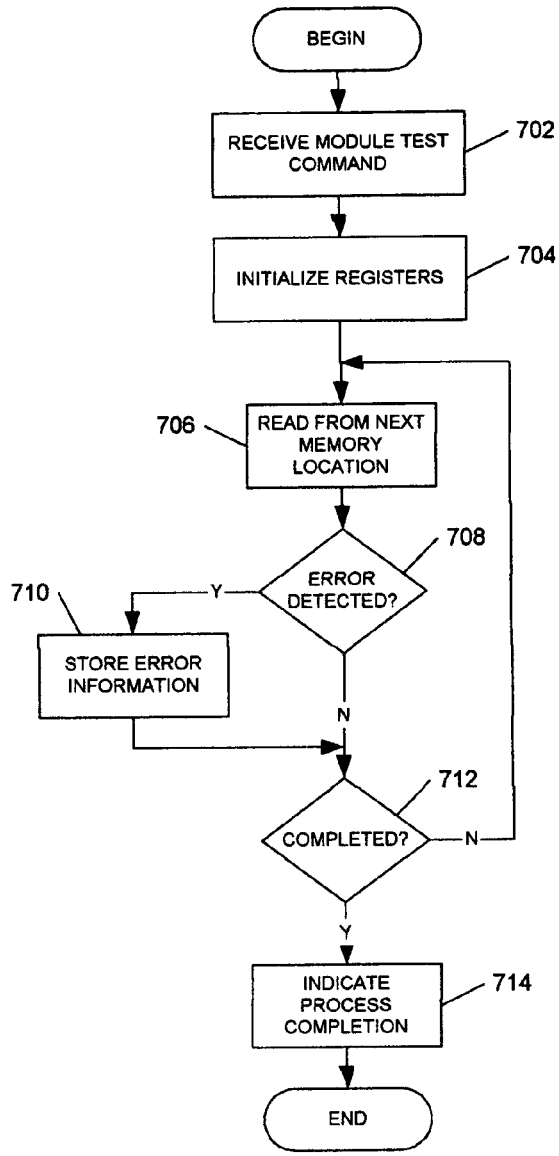
FIG. 7 illustrates a flowchart of a method for a memory module to test memory, according to an embodiment of the inventive subject matter described herein.

Embodiments included above describe how initialization and testing processes are initiated by a processor (e.g., processor 102, FIG. 1) and/or a memory controller (e.g., memory controller 104, FIG. 1). FIGS. 5 and 6, described below, pertain to initialization-related processes performed by a memory module (e.g., memory modules 112, 114, 116, FIG. 1; or memory module 200, FIG. 2). FIGS. 6 and 7, also described below, pertain to test-related processes performed by a memory module. In one embodiment, all or portions of the processes described in conjunction with FIGS. 5-8 are performed by a buffer module (e.g., buffer module 202, FIG. 2). In other embodiments, other functional elements can perform all or portions of the processes.

FIG. 5 illustrates a flowchart of a method for a memory module to initialize memory, according to an embodiment of the inventive subject matter described herein. The method begins, in block 502, when a buffer module receives a Module Initialization command.

The buffer module initializes various registers (e.g., registers 306, FIG. 3), in block 504. In one embodiment, this includes:

1) initializing an address register to a first address to be initialized;
2) initializing a range register that indicates how many locations to initialize;
3) initializing a data register to include an initialization data value to be written to the first address;

4) initializing a Start Initialization register to include a value that indicates, to the initialization/test controller (e.g., module 304), that it should begin the initialization process;

5) initializing an Initialization Complete register to indicate that the initialization process is in progress and not completed; and 6) initializing one or more error registers to indicate that no errors have yet occurred.

In alternate embodiments, more, fewer or different registers can be initialized.

In block 506, the buffer module initializes some or all memory locations, as indicated by the received Module Initialization command. In one embodiment, this is achieved by writing the initialization data value to the first address, incrementing the address register to the next location, and repeating the process until the initialization data value has been written to the last address. During the initialization process, the buffer module keeps track of any write failures, by storing failed write addresses and error types within the error registers, in one embodiment. In an alternate embodiment, write failures are not recorded.

In alternate embodiments, the memory locations can be initialized with differing initialization values, or the writing process can be performed in a non-sequential manner. In addition, in an alternate embodiment, multiple writes can be performed for one or more memory locations.

When the initialization data value has been written to the last address, the buffer module indicates that it has completed the initialization process, in block 508. In one embodiment, this involves placing a value in the Initialization Complete register to indicate that the initialization process is completed. In one embodiment, this register is polled, as described in more detail in FIG. 6. In alternate embodiments, when initialization is completed, the buffer module sends an Initialization Complete message and/or a processor interrupt to the processor, without being polled. The initialization process for the particular memory module then ends.

FIG. 6 illustrates a flowchart of a method for a buffer module to indicate the status of its initialization process, according to an embodiment of the inventive subject matter described herein. In one embodiment, as described previously, after the processor sends a Module Initialization command to a particular module, the processor enters a poll for completion state. This involves the processor occasionally or periodically sending an Initialization Status Query to the memory module. Such a query can be received at any time after the initialization process has begun, in one embodiment. Accordingly, the process illustrated in FIG. 6 can be performed in parallel with the initialization process illustrated in FIG. 5. In addition, the process illustrated in FIG. 6 can be performed multiple times during the initialization process of FIG. 5.

The process begins, in block 602, when a buffer module receives an Initialization Status Query. In response to the message, the buffer module determines whether the initialization process is completed, in block 604. In one embodiment, this involves the initialization/test controller 304 (FIG. 3) evaluating a value within the Initialization Complete register 306, to determine whether the value indicates that the initialization process has completed.

If the initialization process has not completed, then the buffer module returns a "Not Completed" message to the processor, in block 606, and the procedure ends. If the process has completed, the buffer module returns a "Completed" message to the processor, in block 608. In one embodiment, the buffer module also returns a "success" or "failure" indicator, and error information, if any is indicated in the error registers. The success or failure indicator and the error information can be sent as part of the Completed message, or as one or more separate messages, in various embodiments. The error information can include a number of locations for which a failure was detected, and/or the error types, and/or the actual addresses of the failed locations. The information can be used, for example, to perform on-line sparing or other error recovery operations to take place. In another embodiment, no error information is returned in conjunction with the initialization process. After returning the initialization process status, the method ends.

FIGS. 5 and 6, described above, pertain to initialization-related processes. FIGS. 6 and 7, described below, pertain to test-related processes performed by a memory module.

FIG. 7 illustrates a flowchart of a method for a memory module to test memory, according to an embodiment of the inventive subject matter described herein. The method begins, in block 702, when a buffer module receives a Module Test command.

The buffer module initializes various registers (e.g., registers 306, FIG. 3), in block 704. In one embodiment, this includes:

1) initializing an address register to a first address to be tested;

2) initializing a range register that indicates how many locations to test;

3) initializing a data register to include an expected data value (e.g., the initialization data value) that is expected to be read from the first address;

4) initializing a Start Test register to include a value that indicates, to the initialization/test controller (e.g., module 304), that it should begin the testing process;

5) initializing a Test Complete register to indicate that the testing process is in progress and not completed; and 6) initializing one or more error registers to indicate that no errors have yet occurred.

In alternate embodiments, more, fewer or different registers can be initialized.

In block 706, the buffer module reads from the first address, and compares the data value to the expected data value in the data register. A determination is made, in block 708, whether an error has been detected. In one embodiment, an error is considered to be detected if the read data value does not equal the expected data value. In other embodiments, error types other than data pattern mis-compares could be detected.

If an error is detected, then the buffer module stores the error information, in block 710. In one embodiment, this includes storing the address of the error and/or the error type in an error register.

If an error is not detected for that read, or after storing the error information, a determination is made whether the testing process has completed, in block 712. In one embodiment, the process is complete when the last sequential memory address associated with the memory module has been read. If the process has not completed, the address register is incremented to the next location, and the process is repeated until the last address, as indicated in the range register, has been read and evaluated. During the testing process, the buffer module keeps track of any read failures, by storing failed read addresses and/or error types within the error registers, in one embodiment.

During the iterative loop that includes blocks 706, 708, and 710, memory locations are tested in a sequential manner by determining if a particular initialization data value is read from each memory location. In alternate embodiments, the memory locations can be tested with differing expected data values (i.e., if different initialization values were stored), or the testing process can be performed in a non-sequential manner. In addition, in an alternate embodiment, multiple reads can be performed for one or more memory locations.

When the test process is completed, as determined in block 712, the buffer module indicates that it has completed the testing process, in block 714. In one embodiment, this involves placing a value in the Test Complete register to indicate that the testing process is completed. In one embodiment, this register is polled, as described in more detail in FIG. 8. In an alternate embodiment, when testing is completed, the buffer module sends a Test Complete message and/or a processor interrupt to the processor, without being polled. The testing process for the particular memory module then ends.

Figure 8:
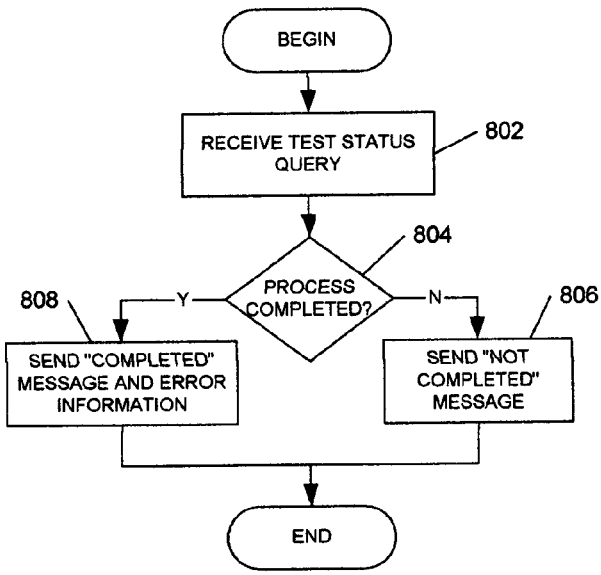
FIG. 8 illustrates a flowchart of a method for a memory module to indicate the status of its testing process, according to an embodiment of the inventive subject matter described herein.

FIG. 8 illustrates a flowchart of a method for a memory module to indicate the status of its testing process, according to an embodiment of the inventive subject matter described herein. In one embodiment, as described previously, after the processor sends a Module Test command to a particular module, the processor enters a poll for completion state. This involves the processor occasionally or periodically sending a Test Status Query to the memory module. Such a query can be received at any time after the testing process has begun, in one embodiment. Accordingly, the process illustrated in FIG. 8 can be performed in parallel with the testing process illustrated in FIG. 7. In addition, the process illustrated in FIG. 8 can be performed multiple times, with multiple data patterns, during the testing process of FIG. 7.

The process begins, in block 802, when a buffer module receives a Test Status Query. In response to the message, the buffer module determines whether the testing process is completed, in block 804. In one embodiment, this involves the initialization/test controller 304 (FIG. 3) evaluating a value within the Test Complete register 306, to determine whether the value indicates that the testing process has completed.

If the testing process has not completed, then the buffer module returns a "Not Completed" message to the processor, in block 806, and the procedure ends. If the process has completed, the buffer module returns a "Completed" message to the processor, in block 808. In one embodiment, the buffer module also returns a "success" or "failure" indicator, and error information, if any is indicated in the error registers. The success or failure indicator and the error information can be sent as part of the Completed message, or as one or more separate messages, in various embodiments. The error information can include a number of locations for which a failure was detected, and/or the error types, and/or the actual addresses of the failed locations. The information can be used, for example, to perform on-line sparing or other error recovery operations to take place. After returning the testing process status, the method ends.

In embodiments described above, initialization and test procedures are efficiently performed by performing parallel operations within multiple memory modules. In still other embodiments, configuration procedures also can be performed in parallel, thus reducing the amount of time that it may take to configure a memory system. For example, multiple memory modules, in parallel, could perform configuration tasks such as determining memory types, setting operating parameters, and setting timing and size parameters. Additional and/or different configuration tasks could be performed in various other embodiments.

Embodiments described above involve memory initialization and memory test procedures, which can be performed together or separately. These procedures can be more generically defined as "memory access procedures" as each procedure involves an access of memory. A "memory access procedure" is also defined herein as a procedure selected from a group of procedures that includes a memory initialization procedure and a memory test procedure. For the initialization procedure, the memory access includes writing to memory. For the testing procedure, the memory access includes reading from memory. When multiple memory modules are performing the same type of memory access procedure (e.g., either an initialization or test procedure), the memory access procedures being performed by the multiple memory modules include substantially similar process steps.

During parallel initialization or parallel test procedures, it can be said that a first memory module performs a first memory access procedure, which accesses first memory locations associated with the memory module, and that at least one additional memory module performs a second memory access procedure, which accesses second memory locations associated with the at least one additional memory module. The first memory access procedure and the second memory access procedure include substantially similar process steps, and at least a portion of the first memory access procedure is performed in parallel with the second memory access procedure.

In one embodiment, the initialization and testing processes are implemented primarily in firmware. In other embodiments, one or more elements of the initialization and/or testing processes can be implemented in hardware and/or software. Implementations in firmware and software include a series of instructions which, when executed by a processor or other computing device, perform the function and produce the result as embodiments described above. Accordingly, a set of computer-executable instructions for performing the initialization and testing processes can be stored on a computer-readable medium (e.g., a hard disk, optical or magnetic disk, read only memory (ROM), RAM, or virtually any other computer-readable medium).

Figure 9:
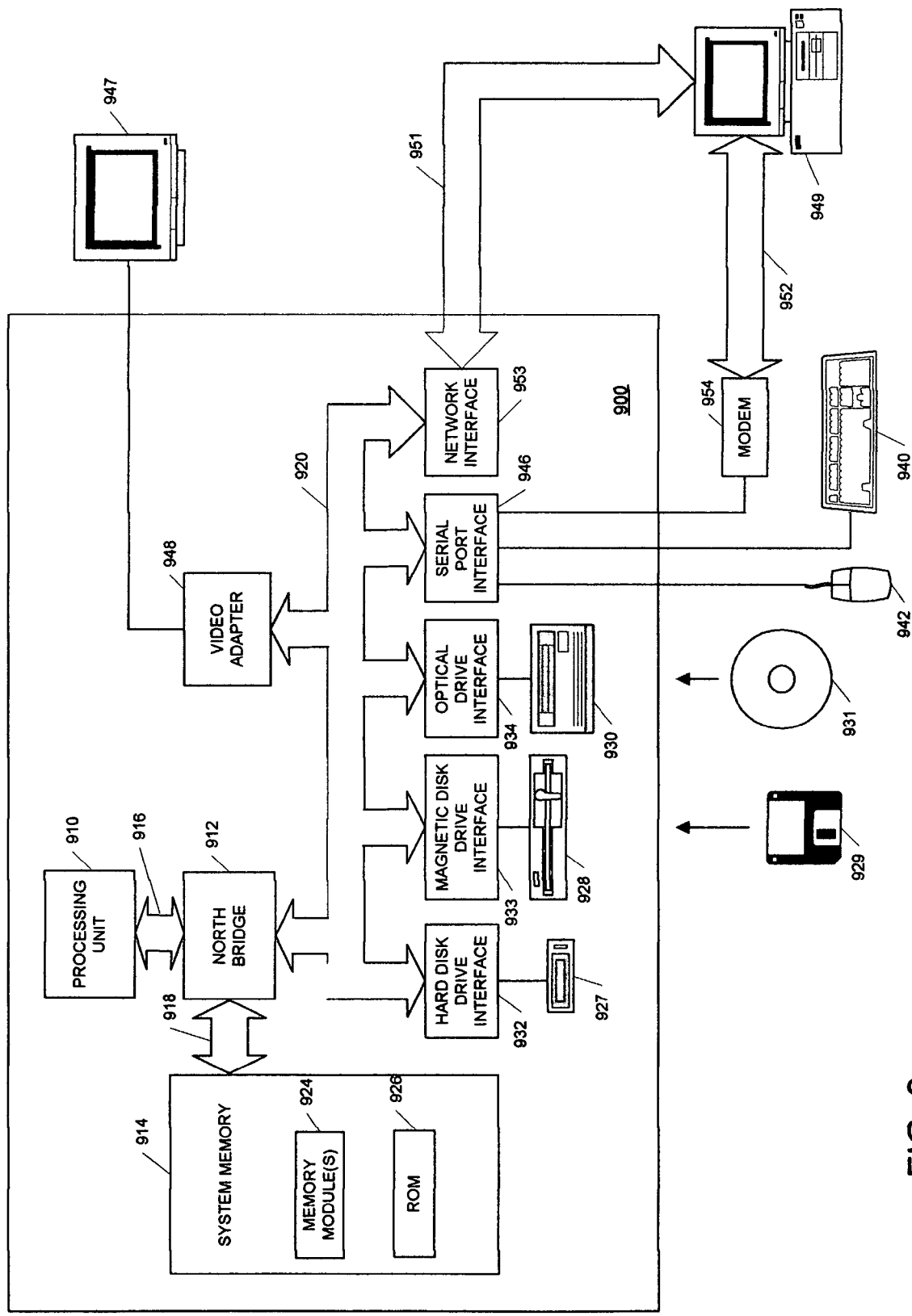
FIG. 9 illustrates a detailed block diagram of a computer system, according to an embodiment of the inventive subject matter described herein.

In addition, embodiments of the inventive subject matter can be included as a part of an electronic system. FIG. 9 illustrates an electronic system, according to an embodiment of the inventive subject matter described herein. FIG. 9 and the following discussion are intended to provide a brief, general description of a suitable environment in which embodiments of the inventive subject matter may be implemented. Those skilled in the art will appreciate that the inventive subject matter may be practiced with various computer system configurations, including stationary or portable personal computers, hand-held devices, multi-processor systems, microprocessor-based or programmable consumer electronics, network personal computers, minicomputers, server computers, mainframe computers, database computers, and the like.

The system shown in FIG. 9 includes a general purpose computer 900, which includes one or more processing units 910, a north bridge 912, system memory 914, and a system bus 920, which interconnects various system components, and may be any of several types of bus structures.

The north bridge 912 acts as an interface between the processing unit 910 and system memory 914, in one embodiment. Accordingly, the north bridge 912 operates as both an input/output (I/O) controller and a memory controller (e.g., memory controller 104, FIG. 1). The north bridge 912 communicates with the processing unit 910 over a processor bus 916, and communicates with system memory 914 over a memory bus 918. As described previously, the memory bus 918 can include multiple channels (e.g., channels 120, FIG. 1).

The system memory 914 is configured according to an embodiment of the inventive subject matter described herein. Accordingly, system memory 914 includes one or more memory modules 924 (e.g., modules 112, 114, 116, FIG. 1). In various embodiments, memory modules 924 are capable of initializing their associated memory devices in parallel with each other. Further, system memory 914 can include a memory controller (e.g., controller 104, FIG. 1) that is separate from the north bridge 912, and/or ROM 926, in various embodiments.

The computer 900 further can include a hard disk drive 927 for reading from and writing to a hard disk, not shown, a magnetic disk drive 928 for reading from or writing to a removable magnetic disk 929, and an optical disk drive 930 for reading from or writing to a removable optical disk 931, such as a compact disk (CD) ROM or other optical media. The hard disk drive 927, magnetic disk drive 928, and optical disk drive 930 can be connected to the system bus 920 by a hard disk drive interface 932, a magnetic disk drive interface 933, and an optical drive interface 934, respectively.

A user may enter requests and information into the computer 900 through input devices, such as a keyboard 940, pointing device 942 or other input devices (not shown). These and other input devices may be connected to processing units 910 through a serial port interface 946 that is coupled to the system bus 920, or may be connected by other interfaces, such as a parallel port, game port or a universal synchronous bus (USB). A monitor 947 or other type of display device also may be connected to the system bus 920 via an interface, such as a video adapter 948. In addition to the monitor, the system may also include other peripheral output devices (not shown), such as speakers and printers.

The computer 900 may operate in a networked environment using logical connections to one or more remote computers, such as a remote computer 949. Computer 900 and remote computer 949 may be clients, servers, routers, network personal computers, peer devices or other network nodes. The logical connections depicted in FIG. 9 include a local area network (LAN) 951 and a wide area network (WAN) 952.

When used in a LAN networking environment, the computer 900 is connected to the local network 951 through a network interface or adapter 953. When used in a WAN networking environment, the computer 900 typically includes a modem 954 or other mechanism for establishing communications over the WAN 952. The modem 954, which may be internal or external, is connected to the system bus 920 via the serial port interface 946. It will be appreciated that the network connections shown are exemplary and that other mechanisms for establishing a communications link between the computers may be used.

Various embodiments of methods and apparatus for initializing and testing memory have been described, along with a description of the incorporation of embodiments within an electronic system. Modifications that would be apparent to those of skill in the art can be made to the various embodiments to achieve the same results. In particular, but not by way of limitation, the arrangements and interconnections among various, illustrated functional blocks and method steps can be different, and other and different functional blocks and steps can be used to achieve the same function, in substantially the same way, to achieve substantially the same result. Further, the type of systems within which embodiments are incorporated can be different (e.g., it can include more, fewer or different elements than those illustrated and described, or the elements can be interconnected in different ways).

Although specific embodiments have been illustrated and described herein, it will be appreciated by those of ordinary skill in the art that any arrangement that is calculated to achieve the same purpose may be substituted for the specific embodiments shown. Many adaptations of the inventive subject matter will be apparent to those of ordinary skill in the art. Accordingly, this application is intended to cover any adaptations or variations of the inventive subject matter. It is manifestly intended that the inventive subject matter be limited only by the following claims and equivalents thereof.

What is claimed is:

1. A method comprising:
performing a first memory access procedure, in response to receiving a first memory access procedure command over a command bus from a memory controller, wherein the first memory access procedure causes a memory module to perform multiple accesses of first memory locations associated with the memory module, and the first memory access procedure is selected from a group of procedures that includes a memory initialization procedure and a memory test procedure.

2. The method of claim 1, further comprising:
sending, over the command bus, a status message, which indicates that the memory module has completed the first memory access procedure.

3. The method of claim 1, further comprising:
receiving a second memory access procedure command over the command bus; and
performing a second memory access procedure, in response to the second memory access procedure command, wherein the second memory access procedure causes the memory module to perform multiple accesses of the first memory locations associated with the memory module, and the second memory access procedure is the memory test procedure.

4. The method of claim 3, further comprising:
sending, over the command bus, a status message, which indicates that the memory module has completed the memory test procedure.

5. A method comprising:
receiving an initialization command over a command bus from a memory controller; and
performing, within a memory module, an initialization procedure, in response to the initialization command, during which the memory module initializes one or more memory storage units by generating and sending data packets with initialization data to the one or more memory storage units.

6. The method of claim 5, further comprising:
sending, over the command bus, a status message, which indicates that the memory module has completed the initialization procedure.

7. The method of claim 5, further comprising:
performing a testing procedure, during which the memory module tests the one or more memory storage units by reading data within memory locations of the one or more memory storage units, and comparing the data with the initialization data.

8. A method comprising:
in a memory module, receiving a test command over a command bus; and
performing a testing procedure, in response to the test command, during which the memory module tests one or more memory storage units by reading data within memory locations of the one or more memory storage units, and comparing the data with expected data.

9. The method of claim 8, further comprising:
sending, over the command bus, a status message, which indicates that the memory module has completed the testing procedure.

10. The method of claim 8, further comprising:
sending, over the command bus, error information, which indicates that the memory module has encountered at least one error during the testing procedure.

11. The method of claim 8, further comprising:
performing an initialization procedure, before performing the testing procedure, during which the memory module initializes the one or more memory storage units by writing initialization data to the memory locations of the one or more memory storage units.

12. A method comprising:
a first memory module performing a first memory access procedure, in response to receiving a first memory access procedure command over a command bus from a memory controller, the first memory access procedure causing the first memory module to perform multiple accesses of first memory locations associated with the memory module, wherein the first memory access procedure is selected from a group of procedures that includes a memory initialization procedure and a memory test procedure; and
at least one additional memory module performing a second memory access procedure, in response to receiving a second memory access procedure command over the command bus from the memory controller, the second memory access procedure causing the at least one additional memory module to perform multiple accesses of second memory locations associated with the at least one additional memory module, wherein the first memory access procedure and the second memory access procedure include substantially similar process steps, and wherein at least a portion of the first memory access procedure is performed in parallel with at least a portion of the second memory access procedure.

13. The method of claim 12, wherein the first memory access procedure and the second memory access procedure include memory initialization procedures performed during an initialization of a computer system.

14. The method of claim 12, further comprising:
the first memory module performing a third memory access procedure, which causes the first memory module to perform multiple additional accesses of the first memory locations associated with the memory module, wherein the third memory access procedure is a memory test procedure; and
the at least one additional memory module performing a fourth memory access procedure, which causes the at least one additional memory module to perform multiple additional accesses of the second memory locations associated with the at least one additional memory module, wherein the fourth memory access procedure is the memory test procedure, and wherein at least a portion of the fourth memory access procedure is performed in parallel with the third memory access procedure.

15. The method of claim 14, wherein the third memory access procedure and the fourth memory access procedure include memory test procedures performed during an initialization of a computer system.

16. A method comprising:
a first memory module performing a first initialization procedure of first memory locations associated with the first memory module, wherein the first initialization procedure is performed in response to a first initialization procedure command initiating with a first processor and communicated via a first memory controller;
at least one additional memory module performing at least one additional initialization procedure of second memory locations associated with the at least one additional memory module, wherein the at least one additional initialization procedure is performed in response to at least one additional initialization procedure command originating with at least one additional processor; and
wherein at least a portion of the first initialization procedure is performed in parallel with at least a portion of the at least one additional initialization procedure.

17. The method of claim 16, further comprising:
the first memory module receiving a module initialization command; and
the first memory module initiating the first initialization procedure in response to receiving the command.

18. The method of claim 17, further comprising:
a processor generating and sending the module initialization command.

19. The method of claim 16, wherein performing the first initialization procedure comprises:
the first memory module generating and sending data packets to the first memory locations, wherein the data packets include initialization data.

20. The method of claim 16, further comprising:
the first memory module performing a first test procedure of the first memory locations; and
the at least one additional memory module performing at least one additional test procedure of the second memory locations, wherein at least a portion of the first test procedure is performed in parallel with at least a portion of the at least one additional test procedure.

21. A method comprising:
generating and sending multiple memory initialization commands to multiple memory modules of a memory subsystem, wherein the memory initialization commands are received by individual memory modules from one of one or more memory controllers;
the multiple memory modules receiving the multiple memory initialization commands; and
selected ones of the multiple memory modules performing an initialization procedure in parallel, in response to receiving an initialization command.

22. The method of claim 21, wherein performing the initialization procedure comprises:
the selected ones of the multiple memory modules generating and sending data packets to memory locations located logically behind the multiple memory modules, wherein the data packets include initialization data.

23. The method of claim 21, further comprising:
polling the selected ones of the multiple memory modules to determine when the selected ones of the memory modules have completed the initialization procedure.

24. The method of claim 21, further comprising:
a processor generating and sending multiple memory test commands to the multiple memory modules;
the multiple memory modules receiving the multiple memory test commands; and
selected ones of the multiple memory modules performing a test procedure in parallel, in response to receiving a test command.

25. The method of claim 24, further comprising:
polling each of the multiple memory modules to determine when each of the memory modules has completed the test procedure.

* * * * *